United States Patent [19]

Imai

[11] Patent Number: 4,890,308
[45] Date of Patent: Dec. 26, 1989

[54] SCANNING PULSE GENERATING CIRCUIT
[75] Inventor: Masaharu Imai, Ina, Japan
[73] Assignee: Olympus Optical Co., Ltd., Tokyo, Japan
[21] Appl. No.: 240,667
[22] Filed: Sep. 6, 1988
[30] Foreign Application Priority Data Sep. 19, 1987 [JP] Japan .................................. 62-233733
Sep. 19, 1987 [JP] Japan .................................. 62-233734

[51] Int. Cl.$^4$ ........................ H03K 5/15; G11C 19/18
[52] U.S. Cl. ........................................ 377/79; 377/76; 377/105; 358/209
[58] Field of Search ..................... 377/76, 78, 79, 104, 377/105; 358/209

[56] References Cited

U.S. PATENT DOCUMENTS

| | | | |
|---|---|---|---|
| 3,617,767 | 11/1971 | Booher | 377/79 |
| 3,638,036 | 1/1972 | Zimbelmann | 377/79 |
| 3,676,709 | 7/1972 | Ducamus et al. | 377/79 |
| 3,829,711 | 8/1974 | Crowle | 377/79 |
| 4,017,741 | 4/1977 | Briggs | 377/79 |

Primary Examiner—John S. Heyman
Attorney, Agent, or Firm—Armstrong, Nikaido, Marmelstein, Kubovcik & Murray

[57] ABSTRACT

A scanning pulse generating circuit has a multiplicity of stages constitued by first basic circuits and second basic circuits which are connected to appear alternatingly in a cascade manner. The first basic circuit is composed of three or four MOS transistors and a feedback capacitor, and includes at least a bootstrap inverter, so as to produce predetermined output pulses upon receipt of driving synchronizing pulses. The second basic circuit has the same construction as the first basic circuit except that it receives different driving synchronizing pulse from that used in the first basic circuit. The output pulses from the respective basic circuits are free from drop of voltage and fluctuation, by virtue of the bootstrap effect. In addiition, power consumption can be reduced without difficulty.

10 Claims, 8 Drawing Sheets

SCANNING PULSE GENERATING CIRCUIT

BACKGROUND OF THE INVENTION

1. Field of the Invention:

The present invention relates to a scanning pulse generating circuit composed mainly of MOS transistors and suitable for use in, for example, solid-state imaging devices.

Figure 1A:
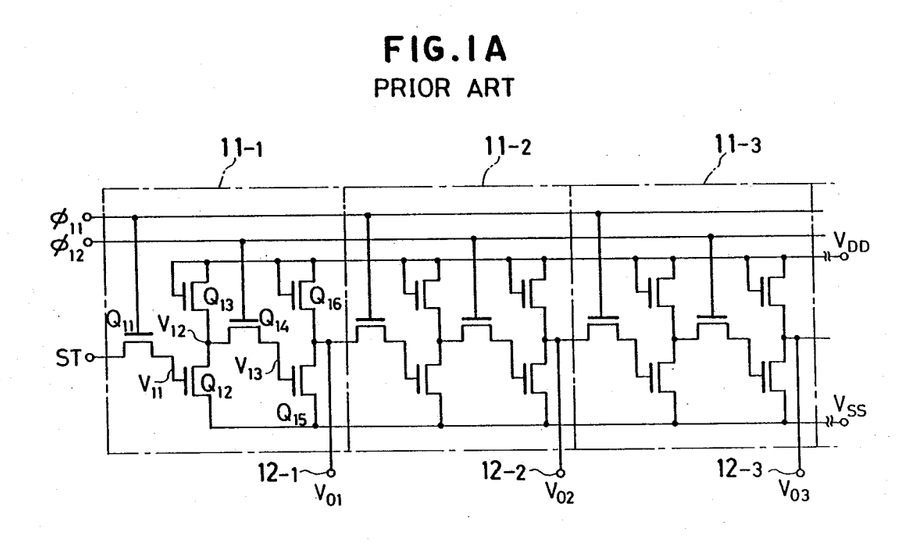
FIG. 1A is a circuit diagram showing the construction of a conventional scanning pulse generating circuit.

2. Description of the Related Art:

FIG. 1A shows a known scanning pulse generating circuit which drives pixels of a solid-state imaging device. This circuit has a plurality of basic circuits each composed of a two-stage inverter comprising a first-stage inverter composed of MOS transistors $Q_{12}$ and $Q_{13}$ and a second-stage inverter composed of MOS transistors $Q_{15}$ and $Q_{16}$, and a pair of signal transmitting MOS transistors $Q_{11}$ and $Q_{14}$. The basic circuits $11_{-1}$, $11_{-2}$, $11_{-3}$, ... are connected in a cascade manner and output terminals $12_{-1}$, $12_{-2}$, $12_{-3}$, ... are led from the connections between adjacent stages of the cascade.

Figure 1B:
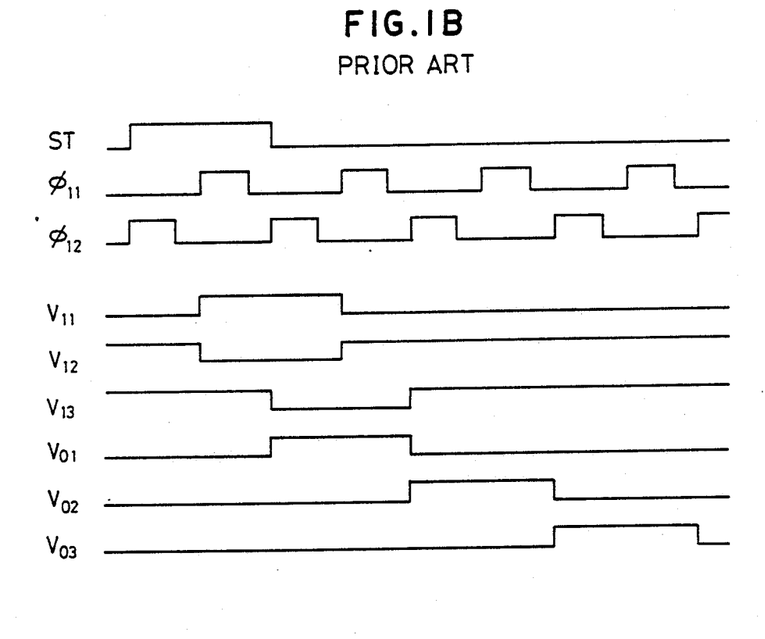
FIG. 1B is a chart showing signal waveforms and voltage waveforms, illustrative of the operation of the scanning pulse generating circuit of FIG. 1A.

In operation, a start pulse ST (see FIG. 1B) is input to the signal transmitting transistor $Q_{11}$. At the same time, clock pulses $\phi_{11}$ and $\phi_{12}$ are input to the signal transmitting transistors $Q_{11}$ and $Q_{14}$. The start pulse ST is delayed by a time corresponding to the period of the clock pulse $\phi_{12}$ so that output pulses $V_{01}$, $V_{02}$, $V_{03}$, ... are derived from the output terminals $12_{-1}$, $12_{-2}$, $12_{-3}$, ... of the basic circuits $11_{-1}$, $11_{-2}$, $11_{-3}$, ... of the respective stages, as shown in FIG. 1B.

Each of the MOS transistors used in the scanning pulse generating circuit of FIG. 1A is of the N-channel type. A symbol $V_{DD}$ repesents positive D.C. source voltage, while $V_{SS}$ represents grounding voltage. Symbols $V_{11}$, $V_{12}$ and $V_{13}$ appearing in FIG. 1B represent the input voltage waveform of the first-stage inverter circuit, output voltage waveform of the first-stage inverter circuit and the input voltage waveform of the second-stage inverter circuit.

This known scanning pulse generating circuit is advantageous in that the operational margin of the scanning pulse generating circuit is high and in that the wiring interconnecting the circuit elements is suitable for attaining a higher density of the circuit arrangement. Unfortunately, however, this known scanning pulse generating circuit suffers from the following disadvantages.

(1) The voltage of the "H" level of the output signal from the basic circuit of each stage is affected by a fluctuation in the threshold voltage of the load transistor $Q_{16}$ incorporated in the second-stage inverter of the basic circuit of the same stage, so that the basic circuits of different stages provide different levels of output signal.

(2) The voltage of the "H" level of the output signal is considerably lowered from the level of the D.C. source voltage $V_{DD}$.

(3) Either one of the two stages of inverter is operative to conduct the inverting operation in all the basic circuits so that electric current is continuously supplied to all basic circuits, whereby the power consumption is increased. This poses a serious problem particularly when a multiplicity of stages of basic circuit, e.g., several hundreds of stages, are employed as in the case of the scanning circuit for a solid-state imaging device.

Using Complementary MOS transistors (referred to as CMOS hereinafter), a scanning pulse generating circuit is obtainable which is capable of operating at high speed with reduced power consumption and which can produce an "H" output level which is substantially the same as the source voltage, i.e., without a substantial drop in the voltage supplied from the source.

However, production of a scanning pulse generating circuit using CMOS transistors arranged in the form of an integrated circuit inconveniently requires a specific production process for forming CMOS transistors and the production process is inevitably complicated. Preferably, the scanning pulse generating circuit is constituted solely by N-channel MOS transistors or P-channel MOS transistros depending on whether the outputs to be obtained are of positive or negative voltage.

SUMMARY OF THE INVENTION

Accordingly, an object of the present invention is to provide a scanning pulse generating circuit which can provide output voltage at a constant level without substantial voltage drop, thereby to overcome the above-described problems of the prior art.

Another object of the present invention is to provide a scanning pulse generating circuit in which the basic circuit of each stage can easily be made up of a reduced number of elements and in which the power consumption is appreciably decreased.

To these ends, according to an aspect of the present invention, there is provided a scanning pulse generating circuit comprising: (a) a plurality of first basic circuits each including: a first MOS transistor with the gate terminal thereof serving as an input terminal; a second MOS transistor connected in series to the first MOS transistor with one of the main electrodes thereof being grounded while the gate terminal thereof being capable of receiving a first synchronizing pulse; a third MOS transistor having the gate terminal thereof connected to the point of juncture between the first and second MOS transistors while one of the main electrodes thereof being connected to a power supply; a fourth MOS transistor connected in series to the third MOS transistor with one of the main electrodes thereof being grounded while the gate terminal thereof being capable of receiving a second synchronizing pulse; and a first capacitive element connected between the point of juncture between the first and second MOS transistors and the point of juncture between the third and fourth MOS transistors, the point of juncture between the third and fourth MOS transistors constituting an output terminal; and (b) a plurality of second basic circuits each including: fifth, sixth, seventh and eighth MOS transistors corresponding to the first, second, third and fourth MOS transistors of the first basic circuit, respectively; and a second capacitive element corresponding to the first capacitive element; the fifth, sixth, seventh and eighth MOS transistors and the second capacitive element being connected in the same manner as the corresponding elements in the first basic circuit, the output terminal of the first basic circuit being connected to the gate terminal of the fifth MOS transistor, the gate terminals of the sixth and eighth MOS transistors being capable of receiving third and fourth synchronizing pulses, respectively; the first and second basic circuits being connected alternatingly in a multiplicity of stages so that scanning pulses are derived from the output terminals of the basic circuits of the successive stages.

According to another aspect of the present invention, there is provided a scanning pulse generating circuit comprising: (a) a plurality of first basic circuit each comprising: a first MOS transistor having an input terminal constituted by one of the main electrodes thereof while the gate terminal thereof being capable of receiving a first synchronizing pulse; a second MOS transistor with the gate terminal thereof connected to the other of the main electrodes of the first MOS transistor and with one of the main electrodes thereof connected to a power supply; a third MOS transistor connected in series to the second MOS transistor with one of the main electrodes thereof being grounded while the gate terminal thereof is capable of receiving a second synchronizing pulse; and a first capacitive element connected between the gate terminal of the second MOS transistor and the point of juncture between the second and third MOS transistors, the point of juncture between the second and third MOS transistors serving as an output terminal; and (b) a plurality of second basic circuits each including: fourth, fifth and sixth MOS transistors corresponding to the first, second and third MOS transistors of the first basic circuit, respectively; and a second capacitive element corresponding to the first capacitive element of the first basic circuit; the fourth, fifth and sixth MOS transistors and the second capacitive element being connected in the same manner as the corresponding elements of the first basic circuit, the output terminal of the first basic circuit being connected to one of the main electrodes of the fourth MOS transistor, the gate terminals of the fourth and sixth MOS transistors being capable of receiving third and fourth synchronizing pulses, respectively; the first and second basic circuits being connected alternatingly in a multiplicity of stages so that scanning pulses are successively output from the output terminals of the basic circuits of the successive stages.

Thus, in the scanning pulse generating circuit according to the present invention, voltage drop is completely eliminated by virtue of the bootstrap effect which is realized by the capacitance of the capacitive element determined to be suitably greater than the parasitic capacitance. This arrangement ensures that all the basic circuits can produce "H" outputs of substantially equal-levels. In addition, power consumption is remarkably reduced because only one basic circuit conducts the inverting operation at any moment. It is also to be pointed out that the pitch of arrangement of the basic circuits, i.e., the distance between adjacent basic circuits, can be reduced owing to the reduced number of elements of the basic circuit.

DESCRIPTION OF THE PREFERRED EMBODIMENTS

Figure 2A:
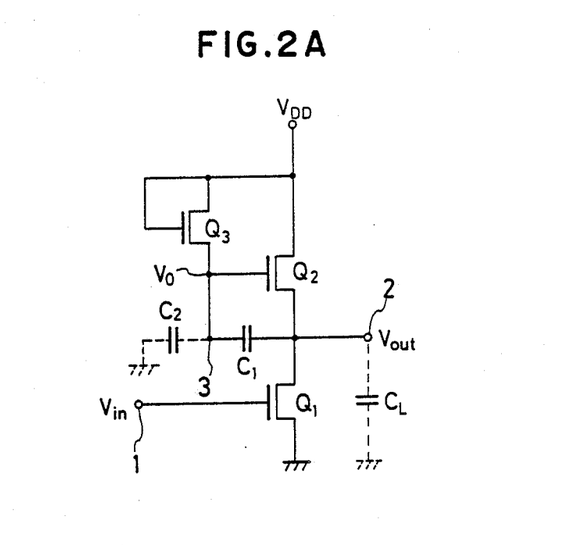
FIG. 2A is a circuit diagram showing the construction of a bootstrap type inverter incorporated in the scanning pulse generating circuit according to the present invention.

Before commencing the description of embodiments, a description will be made of the principle of a bootstrap type inverter employed in the scanning pulse generating circuit according to the present invention. Referring to FIG. 2A, which is a circuit diagram illustrating the bootstrap type inverter comprising N-channel MOS transistors, the gate terminal of a driver transistor $Q_1$ serves as an input terminal 1, while the source terminal of this transistor is connected to a grounding terminal. A load transistor $Q_2$ connected in series to the driver transistor $Q_1$ has a drain terminal which is supplied with a source voltage $V_{DD}$. An output terminal 2 is led from the juncture between both transistors $Q_1$ and $Q_2$. A third transistor $Q_3$ is connected between the gate terminal and the drain terminal of the load transistor $Q_2$. A feedback capacitor $C_1$ is connected between the gate terminal and the source terminal of the load transistor $Q_2$.

The third transistor $Q_3$ cooperates with the feedback capacitor $C_1$ so as to boost the voltage at the point 3 of juncture between the feedback capacitor $C_1$ and the load transistor $Q_2$, i.e., the voltage $V_0$ at the gate terminal of the load transistor $Q_2$. Parasitic capacitance at the juncture point 3 with respect to the ground potential is represented by $C_2$.

The capacitance of the feedback capacitor $C_1$ is so determined that the parasitic capacitance $C_2$ and the capacitance of the feedback capacitor $C_1$ normally meet the condition of $C_1/(C_1+C_2) >$ about 0.6. The parasitic capacitance at the output terminal 2 is represented by $C_L$.

Figure 2B:
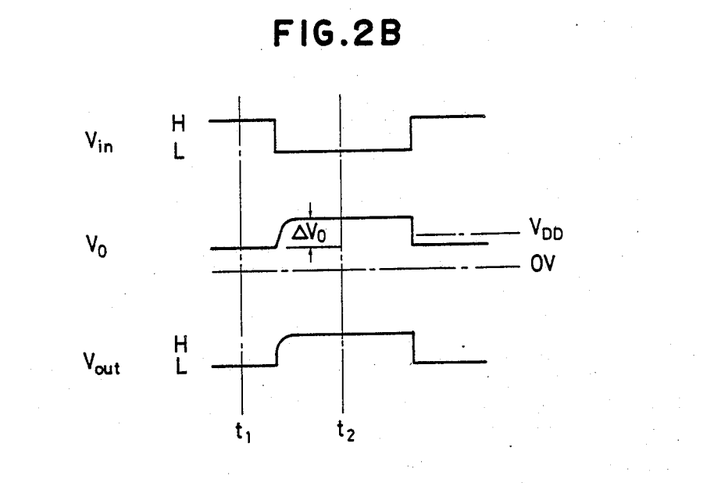
FIG. 2B is a voltage waveform chart illustrative of the operation of the bootstrap type inverter shown in FIG. 2A.

The operation of the bootstrap type inverter will be described with reference to FIG. 2B which shows waveforms of voltages at the input terminal 1, output terminal 2 and the juncture point 3. At a moment $t_1$, the input voltage $V_{in}$ at the input terminal 1 takes the "H" level. In this state, the voltage $V_0$ at the juncture point 3 is determined by the following formula (1) and is lower than the source voltage $V_{DD}$.

$$V_0(t_1) = V_{DD} - V_T - \Delta V_T \qquad (1)$$

In this formula (1), a symbol $V_T$ represents the threshold voltage of the MOS transistor, while $\Delta V_T$ is given by the following equation.

$$\Delta V_T = K(\sqrt{V_0 + 2\phi_F} - \sqrt{2\phi_F})$$

where, K is a value given by:

$$K = \sqrt{2qN_A\epsilon_0 k_s} / C_{ox}$$

wherein,
- $\phi_F$: Fermi potential of the transistor substrate or P-type well
- $N_A$: acceptor density of substrate
- $\epsilon_0$: dielectric constant of vacuum
- $K_s$: specific dielectric constant of substrate
- $C_{ox}$: electrostatic capacitance of gate oxide film Meanwhile, the voltage $V_{out}(t_1)$ at the output terminal 2 is at the "L" level which is almost equal to zero as determined by the following formula (2).

$$V_{out}(t_1) \simeq [g_m(Q_2)/g_m(Q_1)] \times V_{DD}(<V_T) \quad (2)$$

Symbols $g_m(Q_1)$ and $g_m(Q_2)$ represent conductance values of the transistors $Q_1$ and $Q_2$.

When the input voltage $V_{in}$ is lowered to the "L" level, the driver transistor $Q_1$ cuts off so that the output terminal voltage $V_{OUT}$ starts to rise because of the operation of the load transistor $Q_2$ which is always conductive. Simultaneously, the voltage $V_0$ at the juncture point 3 also rises due to the capacitive coupling of the feedback capacitor $C_1$ to satisfy the condition of $V_0 > V_{DD}$ thereby switching off the enhancement type transistor $Q_3$, so that the voltage $V_0$ continues to rise until the voltage increment $\Delta V_0$ reaches a value which is given by the following formula (3).

$$\Delta V_0 = [C_1/(C_1+C_2)] \cdot [V_{OUT}(t_2) - V_{OUT}(t_1)] \quad (3)$$

where, $V_{out}(t_2)$ represents the voltage of the "H" level output obtained at a moment $t_2$.

If the capacitance of the feedback capacitor $C_1$ is determined to be suitably greater than the parasitic capacitance $C_2$, the condition expressed by the following formula (4) is satisfied.

$$V_0(t_2) - V_T - \Delta V_T(V_0(t_2)) < V_{DD} \quad (4)$$

When the condition of formula (4) is met, the load MOS transistor $Q_2$ operates in unsaturated condition so that it directly transmits the drain voltage $V_{DD}$ to the source terminal, so that the output terminal voltage $V_{OUT}(t_2)$ derived from the source terminal becomes equal to the source voltage $V_{DD}$.

A description will be given hereinunder as to shift-register type scanning pulse generating circuits embodying the present invention and incorporating the operation principle of the bootstrap type inverter described hereinabove.

Figure 3A:
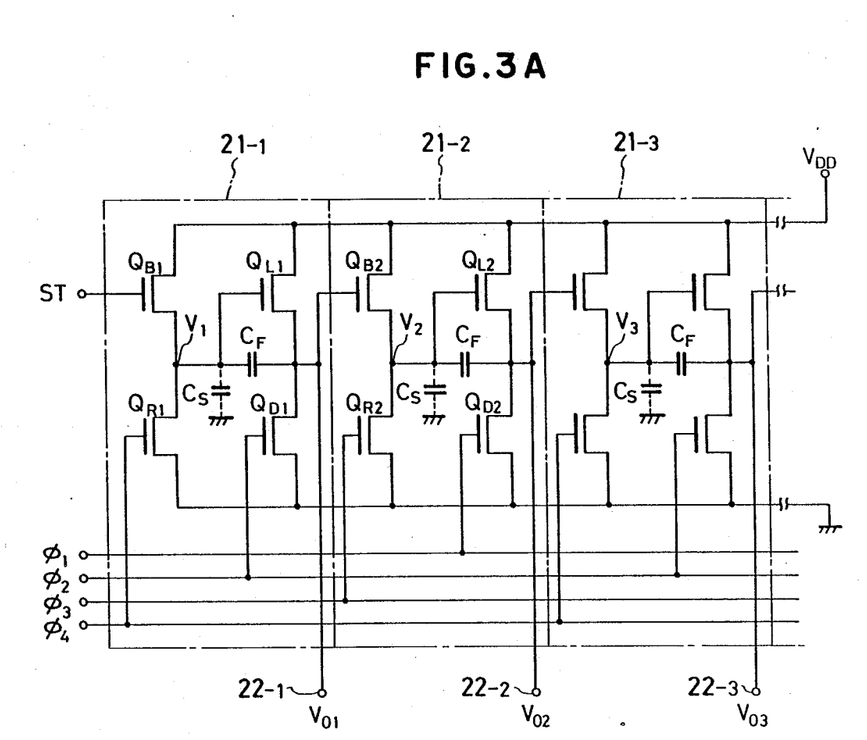
FIG. 3A is a circuit diagram showing the construction of a first embodiment of the scanning pulse generating circuit in accordance with the present invention.

Referring to FIG. 3A showing the circuit of a first embodiment, the basic circuit $21_{-1}$ of a first stage has four MOS transistors $Q_{D1}$, $Q_{L1}$, $Q_{B1}$ and $Q_{R1}$ and a capacitor $C_F$. The MOS transistors $Q_{D1}$, $Q_{L1}$ and $Q_{B1}$ perform operations equivalent to the operation performed by the MOS transistors $Q_1$, $Q_2$ and $Q_3$ of the bootstrap inverter shown in FIG. 2A. First and second MOS transistors $Q_{D1}$ and $Q_{L1}$, which are connected in series, constitute an inverter circuit in which the second transistor $Q_{L1}$ serves as the load transistor while the first transistor $Q_{D1}$ functions as the driver transistor. This inverter circuit is connected between the power supply $V_{DD}$ and the earth terminal.

The capacitor $C_F$ is composed of a MOS diode and corresponds to the feedback capacitor $C_1$ in the bootstrap inverter shown in FIG. 2A. This capacitor $C_F$ is connected between the juncture point between the MOS transistors $Q_{D1}$ and $Q_{L1}$ and the gate terminal of the MOS trtansistor $Q_{L1}$. A symbol $C_S$ represents the parasitic capacitance corresponding to $C_2$ of the bootstrap inverter shown in FIG. 2A. A fourth MOS transistor $Q_{R1}$ is used as a resetting transistor and is connected between the earth terminal and the source terminal of the third MOS transistor $Q_{B1}$ which functions as a biasing transistor. The source terminal of the third MOS transistor $Q_{B1}$ is connected to the gate terminal of the load transistor $Q_{L1}$.

The gate terminal of the third MOS transistor $Q_{B1}$ receives the start pulse ST, while the gate terminals of the driver transistor $Q_{D1}$ and the fourth MOS transistor $Q_{R1}$ receive, respectively, synchronizing pulses $\phi_2$ and $\phi_4$.

An output terminal $22_{-1}$ is led from the point of juncture between the MOS transistors $Q_{D1}$ and $Q_{L1}$ which constitute the inverter circuit.

A basic circuit $21_{-2}$ of the second stage has a construction identical to that of the basic circuit $21_{-1}$ of the first stage, except that it receives different synchronizing pulses. Namely, the basic circuit $21_{-2}$ of the second stage has MOS transistors $Q_{L2}$, $Q_{D2}$, $Q_{B2}$ and $Q_{R2}$, which correspond to the MOS transistors $Q_{L1}$, $Q_{D1}$, $Q_{B1}$ and $Q_{R1}$, and a feedback capacitor $C_F$ and a parasitic capacitance $C_S$. The output terminal $22_{-1}$ of the basic circuit of the first stage is connected to the gate terminal of the MOS transistor $Q_{B2}$ so that the output from the basic circuit $21_{-1}$ of the first stage is input to the basic circuit $21_{-2}$ of the second stage. The gate terminals of the driver transistors $Q_{D2}$ and the fourth MOS transistor $Q_{R2}$ receive synchronizing pulses $\phi_1$ and $\phi_3$, respectively. The basic circuits $21_{-1}$ and $21_{-2}$ of the first and second stages having the described constructions are connected alternately in a cascade-like manner so as to constitute a scanning pulse circuit.

The operation of this scanning pulse generating circuit will be described with reference to FIG. 3B which illustrates waveforms of pulses applied to various portions of the circuit shown in FIG. 3A and the waveforms of voltages obtained at the respective juncture points and output terminals. The description will be made on the assumption that all the MOS transistors are of the N-channel type.

At a moment $t_1$, the start pulse ST applied to the gate terminal of the third MOS transistor $Q_{B1}$ of the first stage basic circuit $21_{-1}$ is changed to "H" level, so that the voltage $V_1$ at the source terminal of the transistor $Q_{B1}$ rises to $V_A$ as a result of supply of the drain current. The conductance values $g_m(Q_{L1})$ and $g_m(Q_{D1})$ of the MOS type transistors $Q_{L1}$ and $Q_{D1}$ are determined beforehand so as to meet the following condition.

$$[g_m(Q_{L1})/g_m(Q_{D1})] \cdot V_{DD} < V_t \quad (5)$$

where, $V_T$ represents the threshold voltage of the MOS transistor.

Under the condition described, the voltage $V_{01}$ obtained at the output terminal of the inverter circuit composed of the transistors $Q_{L1}$ and $Q_{D1}$ remain at a level $V_C$ which is lower than the threshold voltage $V_T$, even when the gate terminal of the load transistor $Q_{L1}$ receives a voltage $V_A$ higher than the threshold voltage $V_T$ while the gate terminal of the driver transistor $Q_{D1}$ receives the synchronizing pulse $\phi_2$ of the voltage level "H" higher than the threshold voltage $V_T$.

At a moment $t_2$, the level of the synchronizing pulse $\phi_2$ is changed to "L" so that the driver transistor $Q_{D1}$ is turned off with the result that the voltage $V_{01}$ at the output terminal is raised due to the supply of the drain current from the load transistor $Q_{L1}$. Partly because of the rise of the output terminal voltage $V_{01}$ and partly because of the operation of the feedback capacitor $C_F$, the voltage $V_1$ at the gate terminal of the load transistor $Q_{L1}$ is incremented by $\Delta V_1$ which is given by the following formula (6).

$$\Delta V_1 = V_B - V_A = \frac{C_F}{C_F + C_S} \cdot (V_{01}(V_1 = V_B) - V_C) \quad (6)$$

where, $V_{01}$ represents the voltage obtained at the output terminal when the voltage $V_1$ ($\equiv V_B$) after the increment of the voltage is applied to the gate terminal of the load transistor $Q_{L1}$.

It is possible to obtain the condition $V_{01}(V_1 = V_B) = V_{DD}$, by making the capacitance of the feedback capacitor $C_F$ to be suitably greater than the parasitic capacitance $C_S$ connected to the gate terminal of the load transistor $Q_{L1}$. The manner in which the voltage at the gate terminal of the load transistor $Q_{L1}$ rises is the same as that in the bootstrap inverter explained before in connection with FIGS. 2A and 2B.

The voltage $V_{01}$ derived from the output terminal of the first stage is held at the "H" level for the period between the moment $t_2$ and a moment $t_3$ so that the biasing MOS transistor $Q_{B2}$ of the second-stage basic circuit $21_{-2}$ receiving this output voltage $V_{01}$ is held on. As a result, the source terminal voltage $V_2$ of the transistor $Q_{B2}$ is raised and set at the voltage $V_A$ and this voltage $V_A$ is maintained even after the moment $t_3$.

At the moment $T_3$, the driver transistor $Q_{D1}$ of the first-stage basic circuit $21_{-1}$ is turned on because the synchronizing pulse $\phi_2$ is switched to "H" level at this moment. As a result, the output terminal voltage $V_{01}$ starts to fall. In consequence, the drain terminal voltage $V_1$ of the MOS transistor $Q_{R1}$ of the first-stage basic circuit $21_1$ tends to come down. Simultaneously with the start of the fall of the output terminal voltage $V_{01}$ or, alternatively, after the elapse of a predetermined time from the moment of the start of the fall of the output terminal voltage, the synchronizing pulse $\phi_4$ is switched to "H" level so that the MOS transistor $Q_{R1}$ is turned on, whereby the voltage $V_1$ is forcibly reduced to the level of the ground potential. This in turn causes the load transistor $Q_{L1}$ to be turned off so that the output terminal voltage $V_{01}$ is lowered to the ground potential.

Figure 3B:
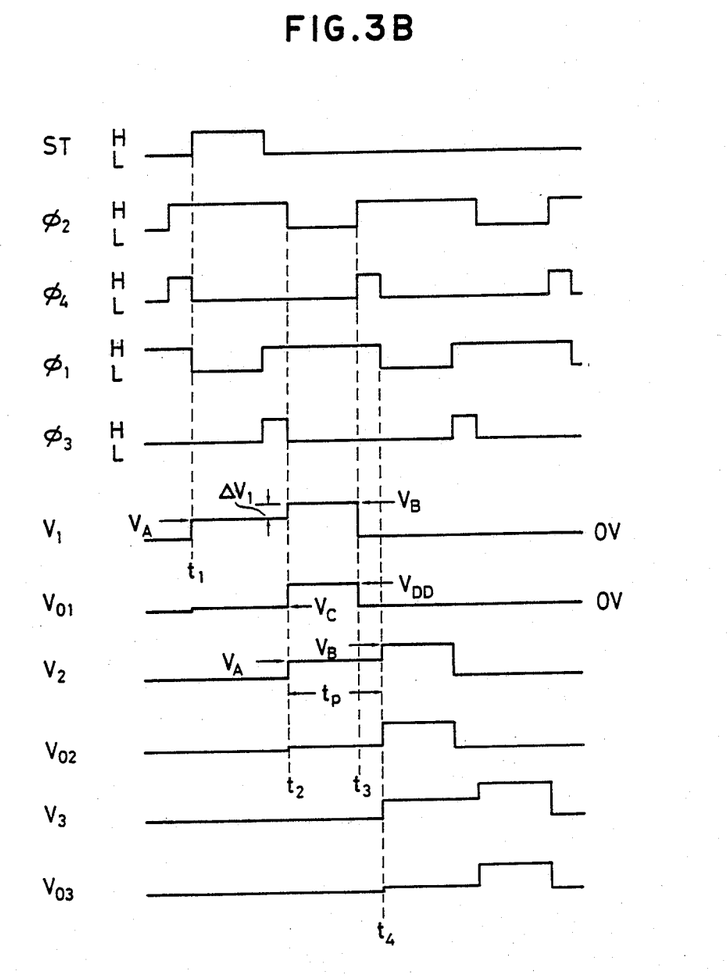
FIG. 3B is a chart showing signal waveforms and voltage waveforms illustrative of the operation of the embodiment shown in FIG. 3A.

At the moment $t_2$, the output terminal voltage $V_{01}$ of the first-stage basic circuit $21_{-1}$, now switched to "H" level, is input so that the second-stage basic circuit $21_{-2}$, in which the source terminal voltage $V_2$ of the MOS type transistor $Q_{B2}$ has been set at $V_A$, operates in accordance with the timing of the synchronizing pulses $\phi_1$ and $\phi_3$ in the chart of FIG. 3B, in the same manner as the first-stage basic circuit $21_{-1}$. That is, the second-stage basic circuit $21_{-2}$ produces an output voltage $V_{02}$ of the same level as the source voltage $V_{DD}$ at a moment $t_4$ at which the synchronizing pulse $\phi_1$ is switched to "L" level, as will be seen from FIG. 3B.

In this manner, output voltages $V_{03}, \ldots$ are successively output from the output terminals $22_{-3}\ldots$ of the basic circuits $21_{-3}\ldots$ of the successive stages, in the period $t_p$ between the moment at which the synchronizing pulse $\phi_2$ falls and the moment at which the synchronizing pulse $\phi_1$ falls.

Figure 4:
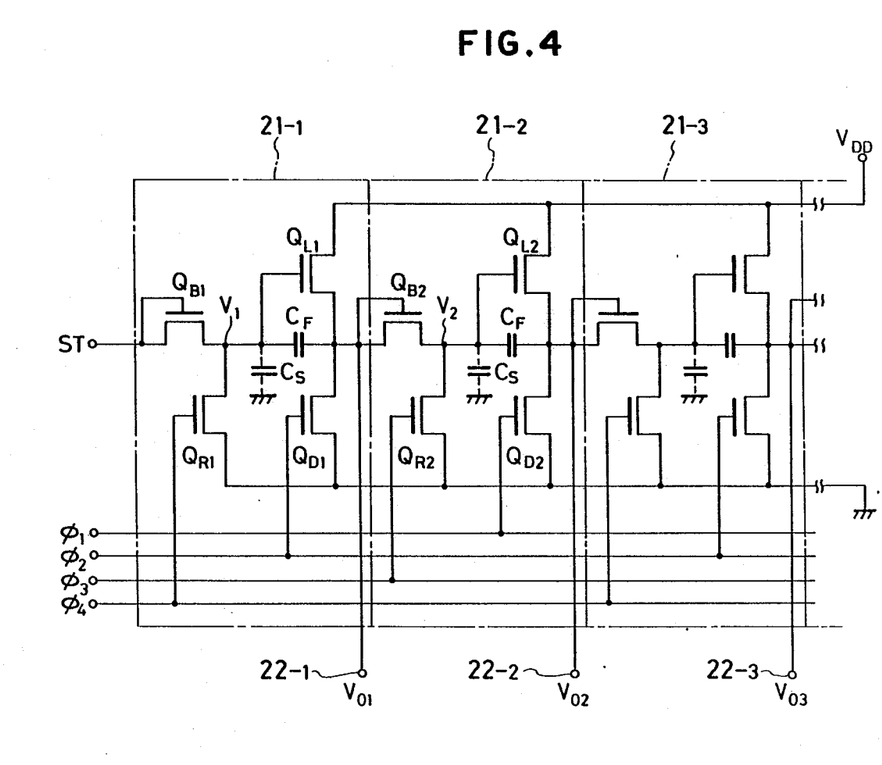
FIG. 4 is a diagram showing the construction of a second embodiment of the present invention.

FIG. 4 shows the circuit arrangement used in a second embodiment of the present invention. In this Figure, the same reference numerals are used to denote the same parts or members as those used in the first embodiment shown in FIG. 3A. The circuit arrangement in the second embodiment is materially the same as that of the first embodiment except that the drain terminals of the third MOS transistors $Q_{B1}, Q_{B2}\ldots$ of the basic circuits $21_{-1}, 21_{-2}\ldots$ of the successive stages are commonly connected to the gate terminals. Timings and waveforms of the operating pulses, as well as the voltage waveforms in various portions of the circuit, are identical to those in the first embodiment explained before in connection with FIG. 3B.

In this embodiment, the supply of the drain currents of the MOS transistors $Q_{B1}, Q_{B2}, \ldots$ is conducted via the juncture of the gate terminal rather than from the source voltages $V_{DD}$, so that the high-speed operation characteristic is somewhat impaired, although the overall performance is materially equivalent to that of the first embodiment. Moreover, the second embodiment offers an advantage in that the wiring area for the elements can be appreciably reduced as compared with the first embodiment.

Figure 5A:
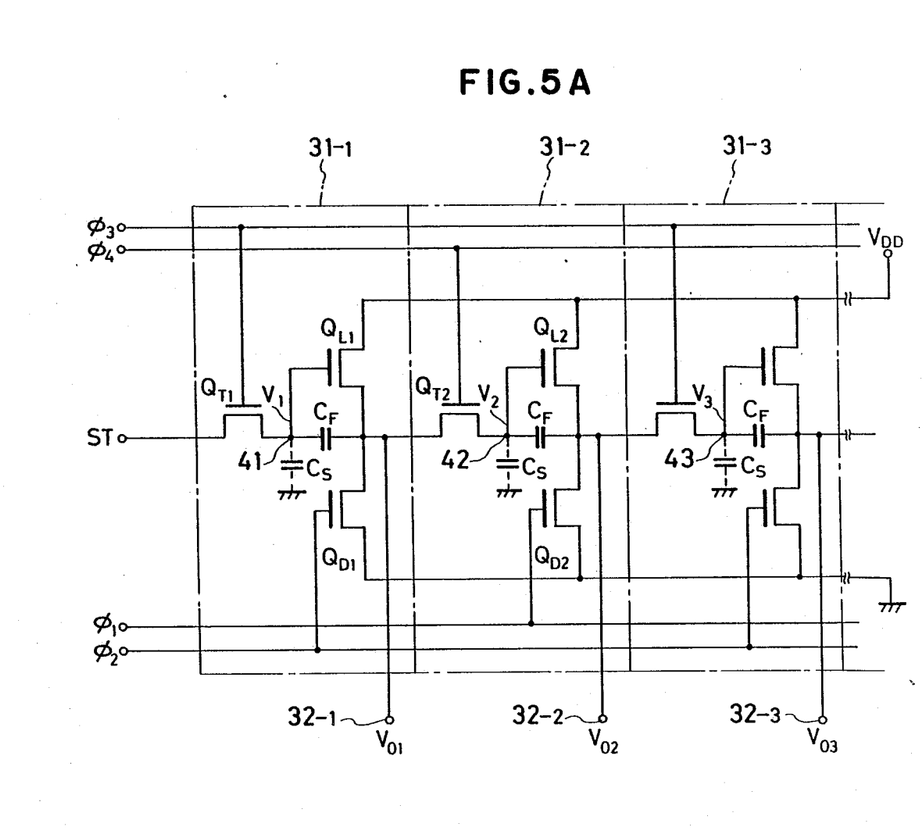
FIG. 5A is a circuit diagram showing the construction of a third embodiment of the scanning pulse generating circuit in accordance with the present invention.

FIG. 5A shows the circuit arrangement in a third embodiment of the present invention. This third embodiment is intended for further reducing the number of elements constituting each basic circuit. A first-stage basic circuit $31_{-1}$ has three MOS transistors $Q_{D1}, Q_{L1}, Q_{T1}$ and a capacitor $C_F$. The MOS transistors $Q_{D1}, Q_{L1}, Q_{T1}$ perform functions equivalent to those performed by the MOS transistors $Q_1, Q_2, Q_3$ of the bootstrap inverter explained before in connection with FIG. 2A. The MOS transistors $Q_{D1}$ and $Q_{L1}$ which are connected in series to each other constitute an inverter circuit in which the transistor $Q_{L1}$ serves as a load transistor while the transistor $Q_{D1}$ functions as a driver transistor. This inverter circuit is connected between the power supply $V_{DD}$ and the grounding terminal. The capacitor $C_F$ also is constituted by a MOS diode and corresponds to the feedback capacitor $C_1$ of the bootstrap inverter shown in FIG. 2A. The capacitor $C_F$ is connected between the gate terminal of the MOS transistor $Q_{L1}$ and the point of juncture between the MOS transistors $Q_{D1}$ and $Q_{L1}$. A symbol $C_S$ represents a parasitic capacitance corresponding to the parasitic capacitance $C_2$.

The source electrode of the MOS transistor $Q_{T1}$ is connected to the gate terminal of the load transistor $Q_{L1}$. The drain terminal of the transistor $Q_{T1}$ receives the start pulse ST while the gate terminal of the same receives the transfer synchronizing pulse $\phi_3$. On the other hand, the gate terminal of the driver transistor $Q_{D1}$ receives the synchronizing pulse $\phi_2$ and the point of juncture between the MOS transistors $Q_{D1}$ and $Q_{L1}$ constituting the inverter circuit constitutes an output terminal $32_{-1}$.

A second-stage basic circuit $31_{-2}$ has a construction which is substantially the same as the first-stage basic circuit $31_{-1}$ except that it receives different synchronizing pulses. Thus, the second-stage basic circuit $31_{-2}$ comprises MOS transistors $Q_{D2}, Q_{L2}$ and $Q_{T2}$ corresponding to the MOS transistors $Q_{D1}, Q_{L1}$ and $Q_{T1}$ of the first-stage basic circuit $31_{-1}$, a feedback capacitor $C_F$ and a parasitic capacitance $C_s$. The output terminal $32_{-1}$ of the first-stage basic circuit $31_{-1}$ is connected to the drain terminal of the MOS transistor $Q_{T2}$ so that the output from the first-stage basic circuit $31_{-1}$ is input to the second-stage basic circuit $31_{-2}$. The gate terminal of the driver transistor $Q_{D2}$ and the gate terminal of the MOS transistor $Q_{T2}$ receive synchronizing pulses $\phi_1$ and $\phi_4$, respectively. The first- and second-stage basic circuits $31_{-1}$ and $31_{-2}$ are alternately connected in a multiplicity of stages, thus constituting a scanning pulse generating circuit of the present invention. The operation of this scanning pulse generating circuit will be described with reference to FIG. 5B, which shows waveforms of pulses applied to various portions of the circuit and waveforms of voltages obtained at various portions of the circuit. The following description is based upon an assumption that all the MOS transistors employed in the scanning pulse generating circuit are of the N-channel type.

Figure 5B:
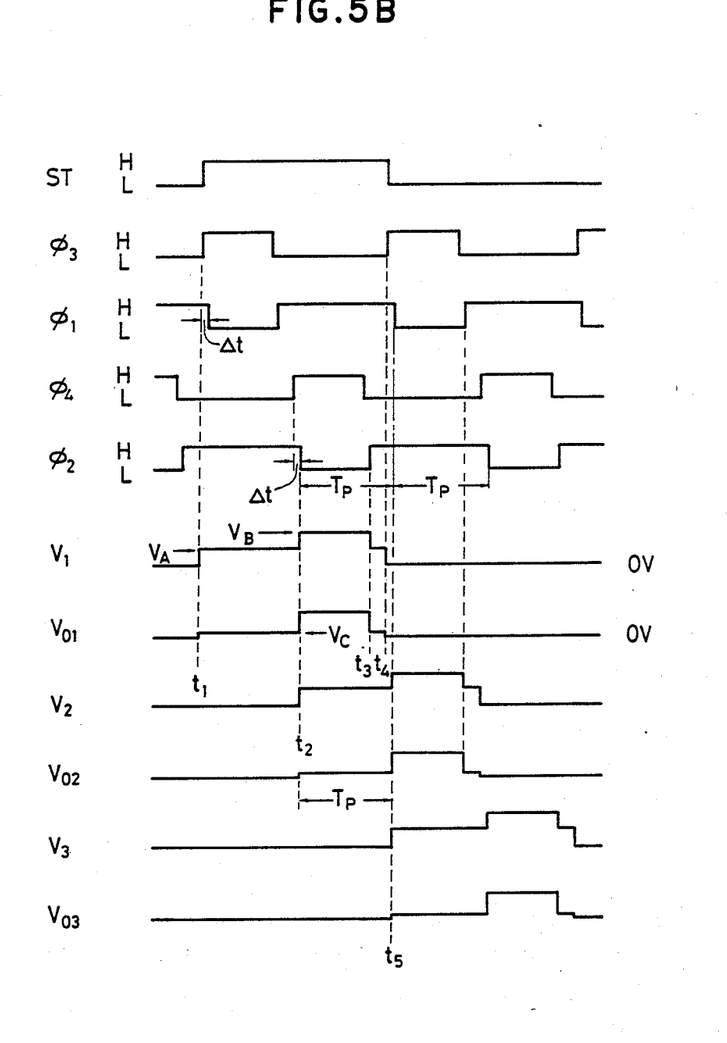
FIG. 5B is a chart showing signal waveforms and voltage waveforms illustrative of the operation of the embodiment shown in FIG. 5A.

At a moment $t_1$, the start pulse ST applied to the drain terminal of the MOS transistor $Q_{T1}$ of the first-stage basic circuit $31_{-1}$ is switched to "H" level. At the same time, the synchronizing pulse (transfer pulse) $\phi_3$ applied to the gate terminal of the MOS transistor $Q_{T1}$ is switched to "H" level, whereby the MOS transistor $Q_{T1}$ is turned on. In consequence, the voltage $V_1$ at the node 41 to which the source terminal of the MOS transistor $Q_{T1}$ is connected is raised to $V_A$. The source terminal voltage $V_1$ in this state is given by the following formula (7).

$$V_1 = V_A \equiv V(H) - V_T - \Delta V_T \qquad (7)$$

where, $V(H)$ represents the voltage of the "H" level of the start pulse ST shown in FIG. 5B. A symbol $V_T$ represents the threshold voltage of the MOS transistor $Q_{T1}$. Amount $\Delta V_T$ of dropping of the voltage due to substrate effect is expressed by the following formula (8).

$$\Delta V_T = K(\sqrt{V_1 + 2\phi_F} - \sqrt{2\phi_F}) \qquad (8)$$

where, K is a value given by $$K = \sqrt{2qN_A\epsilon_0 k_s}/C_{0x}$$

When a voltage $V_1$ which is equal to $V_A$ is applied to the gate terminal of the load transistor $Q_{L1}$, the transistor $Q_{L1}$ is switched on. Meanwhile, the driver transistor $Q_{D1}$ has already been turned on because its gate terminal receives the synchronizing pulse $\phi_2$ the level of which has already been changed to "H", so that the output terminal voltage $V_{01}$ of the first-stage basic circuit is held at the low level of $V_{01}("L") = V_c(< V_T)$. This voltage $V_C$ corresponds to the "L" level of the output voltage $V_{OUT}$ of the bootstrap inverter explained before in connection with FIGS. 2A and 2B, and can materially be determined by the following equation:

$$[g_m(Q_{L1})/g_m(Q_{D1})] \times V_{DD}$$

where, $g_m(Q_{D1})$ and $g_m(Q_{L1})$ represent the conductance values of the driver transistor $Q_{D1}$ and the load transistor $Q_{L1}$ which in cooperation constitute an inverter circuit.

At a moment $T_2$, the level of the synchronizing pulse $\phi_2$ is switched to "L" level so that the driver transistor $Q_{D1}$ is turned off. In this state, the voltage $V_1$ at the node 41 is held at the same level as the voltage $V_1(t_1)$ obtained at the moment $T_1$ so that the load transistor $Q_{L1}$ is held in on state, whereby the voltage $V_{01}$ at the output terminal rises.

Then, the first stage basic circuit operates in accordance with the operation principle of the bootstrap inverter explained before in connection with FIGS. 2A and 2B. Namely, the voltage at the gate terminal of the load transistor $Q_{L1}$ is raised as a result of the rise of the output terminal voltage $V_{01}$ and the operation of the feedback capacitor $C_F$, so that a voltage $V_1(t_2)$ as represented by the following formula (9) is obtained at the node 41.

$$\begin{aligned} V_1(t_2) &= V_B \\ &= V_1(t_1) + \frac{C_F}{C_F + C_S} \cdot (V_{01}(V_1 = V_B) - V_C) \\ &(> V_{DD} + V_T + \Delta V_T) \end{aligned} \qquad (9)$$

where, $V_{01}$ represents the output voltage which is obtained when the voltage $V_1 (= V_B)$ at the node 41 after the rise is supplied to the gate terminal of the load transistor $Q_{L1}$.

By selecting the capacitance of the feedback capacitor $C_f$ to be suitably greater than the parasitic capacitance $C_S$ connected to the gate terminal of the load transistor $Q_{L1}$, it is possible to obtain the following conditions.

$$V_{01}(V_1 = V_B) = V_{DD}$$

The output terminal voltage $V_{01}$ of the first-stage basic circuit $31_{-1}$ is maintained at "H" level, i.e., at the same level as the source voltage $V_{DD}$, over a period between the moment $t_2$ and a moment $t_3$ at which the synchronizing pulse $\phi_2$ is switched to "H" level. At the moment $t_2$, the synchronizing pulse $\phi_4$ has been set at "H" level so that the MOS transistor $Q_{T2}$ of the second-stage basic circuit $31_{-2}$ has been turned on. In consequence, the output voltage $V_{01} (= V_{DD})$ of the first-stage basic circuit $31_{-1}$ is transmitted to the source terminal of the transistor $Q_{T2}$, whereby the voltage at the node 42 is changed to $V_2(t_2)$. The value of this voltage $V_2(t_2)$ equals the voltage $V_1(t_1) = V_A$ unless the threshold voltage $V_T$ of the MOS transistor $Q_{T1}$ and the MOS transistor $Q_{T2}$ is changed. This value of the voltage $V_2(t_2)$ is maintained even after the moment $T_3$.

At the moment $t_3$, the synchronizing pulse $\phi_2$ is switched to "H" level so that the driver transistor $Q_{D1}$ is turned on, with the result that the output terminal voltage $V_{01}$ starts to fall to a level $V_{01}(t_3) = V_C$, so that the voltage $V_1$ at the node 41 of the first-stage basic circuit $31_{-1}$ is lowered to the level $V_A$. Subsequently, at a moment $t_4$, the start pulse ST is switched to "H" level while the synchronizing pulse $\phi_3$ is switched to "H" level, whereby the source terminal of the MOS transistor $Q_{T1}$ is switched to "L" level with the result that both the voltage $V_1(t_4)$ at the node 41 and the output terminal voltage $V_{01}(t_4)$ are reduced to the grounding level.

The second-stage basic circuit $31_{-2}$ receives the output terminal voltage $V_{01}$ of the first-stage basic circuit $31_{-1}$ which was set at "H" level at the moment $t_2$. At the same time, the voltage $V_2(t_2)$ at the node 42 is set at $V_A$. The second-stage basic circuit $31_{-2}$ therefore performs the same operation as the operation of the first-stage basic circuit $31_{-1}$ in accordance with the synchronizing pulses $\phi_1$ and $\phi_4$ the waveforms and timing of which are shown in FIG. 5B, so that an output voltage $V_{02}$ ($=V_{DD}$) of "H" level is obtained from the output terminal $32_{-2}$ thereof at the moment $t_5$ at which synchronizing pulse $\phi_1$ is switched to "L" level. Thereafter, the base circuits $31_{-3}, \ldots$ of the third and subsequent stages operate in the same manners as those described in accordance with the synchronizing pulses $\phi_1$ to $\phi_4$ shown in FIG. 5B, so that output voltages of "H" level which is equal to $V_{DD}$ are successively derived from the output terminals $32_{-2}, \ldots$ in a successively-shifted manner with a period $T_P$ which is equal to the length of time between the moment at which the synchronizing pulse $\phi_2$ falls and the moment at which the synchronizing pulse $\phi_1$ falls.

In the chart shown in FIG. 5B, the mesial magnitude time width $\Delta t$ between the rise of the synchronizing pulse $\phi_3$ and the fall of the synchronizing pulse $\phi_1$, and the mesial magnitude time $\Delta t$ between the rise of the synchronizing pulse $\phi_4$ and the fall of the synchronizing pulse $\phi_2$ are determined to meet the condition of $\Delta t=0$. This, however, is not essential and the substantially same effect can be obtained even under the condition of $\Delta t=0$.

In the embodiments described hereinbefore, the outputs from the output terminals of the basic circuits of the successive stages are used as the scanning pulses. The "L" level of the output voltages from the respective output terminals are determined by the "H" level of the synchronizing pulses $\phi_1$ and $\phi_2$ so that there is a risk that fluctuation may occur in the "L" level of every other output voltages due to difference in the "H" level between the synchronizing pulses $\phi_1$ and $\phi_2$. In order to obviate such a fluctuation, it is advisable to arrange such that only the outputs from the group of basic circuits driven by the synchronizing pulse $\phi_1$ or the group of basic circuits driven by the other synchronizing pulse $\phi_2$ are used as the scanning pulses.

As will be understood from the foregoing description, the present invention offers the following advantages.

(1) The "H" level of the outputs from the basic circuits of the respective stages of the scanning pulse generating circuit can be maintained substantially constant at the level of the source voltage $V_{DD}$ without being affected by variable factors or parameters such as the threshold voltage $V_T$ of the MOS transistor.

(2) The output voltage exhibits no drop at all with respect to the clock voltage and the power supply voltage, by virtue of the booster-type bootstrap effect produced by the bootstrap inverter, so that the scanning pulse generating circuit can be driven at a compareatively low driving voltage.

(3) Although the scanning pulse generating circuit of the invention is of inverter type or ratio type, the power consumption is almost constant regardless of the number of stages of the basic circuit, because only one stage conducts the inverting operation to consume the electrical power at any time during the operation of the scanning pulse generating circuit. This advantage becomes more appreciable as the number of stages of the scanning pulse generating circuit is increased.

(4) The number of elements to be employed in each basic circuit is as small as three to four, so that the wiring space can be saved. This in turn contributes to a reduction in the pitch or spacing between the basic circuits of adjacent stages, thus realizing a higher scale of integration of the circuit.

When the scanning pulse generating circuit of the present invention is applied to a solid-state imaging device, it is possible to eliminate any fixed pattern noise attributable to the operation of the scanning pulse generating circuit, by virtue of the advantage (1) explained above. In addition, the advantage (4) explained above makes it possible to design and construct solid-state imaging devices having higher scale of integration and employing a greater number of pixels. It is also possible to suppress generation of heat in the regions around the pixel arrays by virtue of the advantage (3) and, hence, to eliminate increase in the level of dark outputs from the pixel arrays.

What is claimed is:

1. A scanning pulse generating circuit comprising:
   (a) a plurality of first basic circuits each including:
      a first MOS transistor with the gate terminal thereof serving as an input terminal;
      a second MOS transistor connected in series to said first MOS transistor with one of main electrodes thereof being grounded while the gate terminal thereof being capable of receiving a first synchronizing pulse;
      a third MOS transistor having the gate terminal therof connected to the point of juncture between said first and second MOS transistors while one of the main electrodes thereof being connected to a power supply;
      a fourth MOS transistor connected in series to said third MOS transistor with one of the main electrodes thereof being grounded while the gate electrode thereof being capable of receiving a second synchronizing pulse; and
      a first capacitive element connected between the point of juncture between said first and second MOS transistors and the point of juncture between said third and fourth MOS transistors, the point of juncture between said third and fourth MOS transistors constituting an output terminal; and
   (b) a plurality of second basic circuits each including:
      fifth, sixth, seventh and eighth MOS transistors corresponding to said first, second, third and fourth MOS transistors of said first basic circuit, respectively; and
      a second capacitive element corresponding to said first capacitive element;
      said fifth, sixth, seventh and eighth MOS transistors and said second capacitive element being connected in the same manner as the corresponding elements in said first basic circuit, said output terminal of said first basic circuit being connected to the gate terminal of said fifth MOS transistor, the gate terminals of said sixth and eighth MOS transistors being capable of receiving third and fourth synchronizing pulses, respectively;
      said first and second basic circuits being connected alternately in a multiplicity of stages so that scanning pulses are derived from the output terminals of said basic circuits of the successive stages.

2. A scanning pulse generating circuit as set forth in claim 1, wherein the other of said main electrodes of said first MOS transistor of said first basic circuit and the other of said main electrodes of said fifth MOS transistor of said second basic circuit are respectively connected to said power supply.

3. A scaning pulse generating circuit as set forth in claim 1, wherein the other of said main electrodes of said first MOS transistor of said first basic circuit and the other of said main electrodes of said fifth MOS transistor of said second basic circuit are connected to the gate terminals of the respective MOS transistors.

4. A scanning pulse generating circuit as set forth in claim 1, wherein each of said first and second capacitive elements are constituted by a MOS diode.

5. A scanning pulse generating circuit as set forth in claim 2, wherein each of said first and second capacitive elements are constituted by a MOS diode.

6. A scanning pulse generating circuit as set forth in claim 3, wherein each of said first and second capacitive elements are constituted by a MOS diode.

7. A scanning pulse generating circuit as set forth in claim 1, wherein only the outputs from the group of said first basic circuits or the outputs from the group of said second basic circuits are used as the scanning pulses.

8. A scanning pulse generating circuit comprising:
(a) a plurality of first basic circuit each including:
a first MOS transistor having an input terminal constituted by one of the main electrodes thereof while the gate terminal thereof being capable of receiving a first synchronizing pulse;
a second MOS transistor with the gate terminal thereof connected to the other of the main electrodes of said first MOS transistor and with one of the main electrodes thereof connected to a power supply;
a third MOS transistor connected in series to said second MOS transistor with one of the main electrodes thereof being grounded while the gate terminal thereof is capable of receiving a second synchronizing pulse; and
a first capacitive element connected between said gate terminal of said second MOS transistor and the point of juncture between said second and third MOS transistors, said point of juncture between said second and third MOS transistors serving as an output terminal; and
(b) a plurality of second basic circuits each including:
fourth, fifth and sixth MOS transistors corresponding to said first, second and third MOS transistors of said first basic circuit, respectively; and
a second capacitive element corresponding to said first capacitive element of said first basic circuit;
said fourth, fifth and sixth MOS transistors and said second capacitive element being connected in the same manner as the corresponding elements of said first basic circuit, said output terminal of said first basic circuit being connected to one of the main electrodes of said fourth MOS transistor, the gate terminals of said fourth and sixth MOS transistors being capable of receiving third and fourth synchronizing pulses, respectively;
said first and second basic circuits being connected alternatingly in a multiplicity of stages so that scanning pulses are successively output from said output terminals of said basic circuits of the successive stages.

9. A scanning pulse generating circuit as set forth in claim 8, wherein each of said first and second capacitive elements is constituted by a MOS diode.

10. A scanning pulse generating circuit as set forth in claim 8, wherein only the outputs from the group of said first basic circuits or the outputs from the group of said second basic circuits are used as the scanning pulses.

* * * * *